(12) United States Patent
Chausse (10) Patent No.: US 8,853,073 B2
(45) Date of Patent: Oct. 7, 2014

(54) METHOD FOR PRODUCING VIAS (71) Applicant: Commissariat a l'Energie Atomique et aux Energies Alternatives, Paris (FR)

(72) Inventor: Pascal Chausse, Seyssinet Pariset (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/947,467

(22) Filed: Jul. 22, 2013

(65) Prior Publication Data
US 2014/0051228 A1 Feb. 20, 2014

(30) Foreign Application Priority Data
Jul. 25, 2012 (FR) .................................. 12 57226

(51) Int. Cl.
*H01L 21/4763* (2006.01)
(52) U.S. Cl.
USPC ............ 438/637; 438/638; 438/672; 438/675
(58) Field of Classification Search
USPC ......... 438/618, 622, 637, 638, 666, 667, 668, 438/672, 675
See application file for complete search history.

(56) References Cited

U.S. PATENT DOCUMENTS

| 2005/0255691 | A1* | 11/2005 | Ding et al. ................... 438/627 |
| 2008/0296776 | A1 | 12/2008 | Skog et al. |
| 2009/0294983 | A1 | 12/2009 | Cobbley et al. |
| 2010/0176469 | A1* | 7/2010 | Schmollngruber et al. .. 257/419 |
| 2011/0180936 | A1 | 7/2011 | Cobbley et al. |
| 2012/0133048 | A1 | 5/2012 | Lee et al. |

FOREIGN PATENT DOCUMENTS

| EP | 1 998 371 A1 | 12/2008 |
| FR | 2 901 635 A1 | 11/2007 |

OTHER PUBLICATIONS

Joshi, R. V., "A New Damascene Structure for Submicrometer Interconnect Wiring", IEEE Xplore Digital Library, Electron Device Letters, vol. 14, Issue: 3, Mar. 1993, 1 page.

(Continued)

*Primary Examiner* — Kevin M Picardat
(74) *Attorney, Agent, or Firm* — Oblon, Spivak, McClelland, Maier & Neustadt, L.L.P.

(57) ABSTRACT

Method for producing at least one via (200) in the thickness of a substrate and an electrically conducting line (280) connected to the via (200) and formed on a face (220) of the substrate, comprising: forming, from the face (220), a via cavity comprising a side wall and a bottom; forming an isolating layer (240) on the side wall and the bottom of the cavity; forming at least one line pattern on the face (220) of the substrate, with the line pattern opening into the via cavity; filling with an electrically conducting material the line pattern and the via cavity, a filling so configured as not to totally fill said cavity; Forming at least one line pattern comprises, after forming the isolating layer (240), the forming of a trench (244) in a portion of the isolating layer (240) positioned on the face (220).

12 Claims, 9 Drawing Sheets (56) References Cited

OTHER PUBLICATIONS

Kaanta, C., "Submicron Wiring Technology with Tungsten and Planarization", IEEE Xplore Digital Library, Electron Devices Meeting, vol. 33, 1987, 1 page.

Henry, D., "Through Silicon Vias Technology for CMOS Image Sensors Packaging: Presentation of Technology and Electrical Results", IEEE Xplore Digital Library, Electronics Packaging Technology Conference, Dec. 9-12, 2008, 1 page.

Rebha El Farhane et al., "A Successful Implementation of Dual Damascene Architecture to Copper TSV for 3D High Density Applications", IEEE Xplore Digital Library, 3D Systems Integration Conference (3DIC), Nov. 16-18, 2010, 4 pages.

French Preliminary Search Report issued Apr. 9, 2013, in French Application No. 12 57226 filed Jul. 25, 2012 (with English Translation of Categories of Cited Documents).

* cited by examiner

Prior Art

Prior Art

Prior Art

Prior Art

Prior Art

Prior Art

METHOD FOR PRODUCING VIAS

TECHNICAL FIELD OF THE INVENTION

The present invention generally relates to the three-dimensional (3D) assembling of electronic chips and more particularly the forming of through vias and the redistribution of the signals among the chips of a 3D stack of chips.

STATE OF THE ART

Figure 1A:
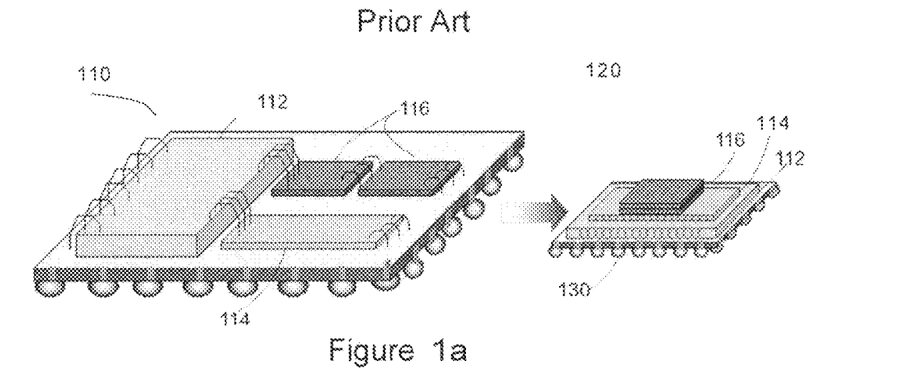
FIGS. 1a and 1b are exemplary three-dimensional (3D) chips assembling.

As illustrated in FIG. 1a, the devices produced by the micro-electronics industry, whether purely electronic like « integrated circuit» (or IC) or « micro electro mechanical system» (or MEMS), are more and more often assembled, no longer by positioning these one along another in a planar package 110 as has long been the case, but by stacking these on one another in a 3D package 120. As shown, this package is typically a BGA, the acronym of « ball grid array», type package wherein the interconnections with the outside are obtained through a « ball grid array» 130. In addition to the fact that a significant reduction in the required space is thus obtained, the 3D packages also make it possible to significantly reduce the length of the interconnection lines between the chips. This results in enhanced performances and/or a reduction in current consumption. Such improvements, combined with a reduction in manufacturing costs obtained through a further automatization enabled by this mounting type, result in such 3D assemblies being increasingly used and the field of application thereof widening.

However, the vertical interconnection of chips and the redistribution of the interconnection electric signals between the various levels still raise problems characteristic of such assembling mode. As a matter of fact, « through vias», generally designated by the acronym TSV for « through silicon via», must be used which, as indicated by the name thereof, are so designed as to completely go through the chips, which are generally made of silicon.

Figure 1B:
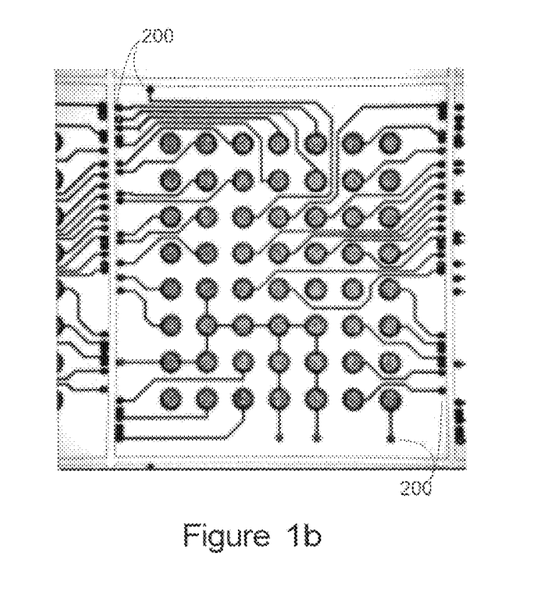

TSVs make it possible to connect the electric signals from the active face of an electronic chip, the one where circuits have been produced on the surface and which is currently called the « frontside», toward the opposed face thereof, currently called the « backside». As shown in the example of FIG. 1b, such signals are then distributed on the backside of each chip, using a redistribution layer or RDL, the acronym of « re-distribution layer». The essential role of the layer consists in electrically connecting each one of the TSVs 200, generally positioned on the periphery of the chip to be assembled, with a specific mounting land in order to be able to route the corresponding signal to the outside of the package protecting the chips.

The through vias or TSVs are, in some cases, produced lastly according to a so-called « via last» method, after the production of chips. Typically, chips from different technologies are assembled in a package, as shown in FIG. 1a, where for example, a memory chip 112, a logic chip 114 and passive circuits 116 are desirably stacked.

The execution of the through vias and of the redistribution level is currently obtained by the « via last» method according to a process which is described hereinafter, in FIGS. 2a to 2h. Upon completion of such conventional process, a via is obtained which is typically very deep, with a potentially high « aspect ratio», and partially filled with a conducting material such as copper. Filling is only partial since a complete filling would entail a very important consumption of materials to be deposited, with the deposits then being on the whole wafer. The method includes numerous steps and additionally the obtained surface of the distribution level is not planar, as we will see. As the ever thicker assembling of chips increases the density of vertical interconnections, the horizontal redistribution thereof may request several levels of redistribution and a better definition on each level. However, this is hardly compatible with the present technology.

One object of the invention is thus to describe an improved method for forming through vias and a redistribution layer which at least partially remedies the disadvantages of the standard method.

The other objects, characteristics and advantages of the present invention will appear when reading the following description and referring to the appended drawings. Other advantages may of course be integrated.

SUMMARY OF THE INVENTION

One aspect of the invention relates to a method for producing at least one via in the thickness of a substrate and an electrically conducting line connected to the via and formed on a face of the substrate, with said method comprising:
  forming, from the face, a via cavity comprising a side wall and a bottom;
  forming an isolating layer on the side wall and the bottom of the cavity and on the face of the substrate;
  forming at least one line pattern on the face of the substrate, comprising forming a trench in a portion of the isolating layer positioned on the face, with the trench opening into the via cavity;
  filling with an electrically conducting material both the line pattern and the via cavity, a filling so configured as not to totally fill said cavity.

Whereas the present techniques are prejudiced against the distinct and successive characteristics of the steps relating to the forming of the RDL line patterns and the steps relating to the forming of the via elements, the invention combines production phases by intimately associating line and via patterns through the creation of trenches directly into the isolating layer. Thanks to the invention, the patterns include trenches which are hollow parts with respect to the surface of the substrate, with the redistribution lines thus having, after the patterns are filled, channels below the upper surface of the face of the substrate.

Filling the line pattern and the via cavity is advantageously simultaneous, thanks to the invention, i.e. belongs to a common phase. Filling may include several steps executed both for the line pattern and for the via cavity.

Another aspect of the invention is an electronic device including a substrate and at least one via and one conducting line.

BRIEF DESCRIPTION OF THE FIGURES

The aims, objects, characteristics and advantages of the invention will be better understood when reading the following description of one embodiment of the latter, which is illustrated by the following appended drawings, wherein.

The appended drawings are given as examples and are not intended to limit the invention.

DETAILED DESCRIPTION OF THE INVENTION

Prior to carrying out a detailed review of embodiments of the invention, optional characteristics which may be used as a combination or an alternative solution, can be found in the following:

- forming a trench is obtained by etching, simultaneously with the removal by said etching of the portion of the isolating layer located on the bottom of the cavity.
- etching is preceded by a step of photolithography so configured as to define a trench pattern.
- filling has a thickness at least equal to one dimension in depth of the trench.
- it includes, after filling, thinning through the face of the substrate until the electrically conducting material disappears outside the trench.
- thinning is obtained by chemical mechanical polishing.
- filling is executed in two steps comprising a first step of depositing a conducting continuous bottom and a second step of electrolytic growth so configured as to fill at least one trench without totally filling the via cavity.
- filling is followed by the deposition of a passivation layer.
- the passivation layer is made of a dielectric material.
- depositing a passivation layer is carried out so as to integrally fill the via cavity.
- the passivation layer is made of a polymer material and depositing the passivation layer is executed onto the face of the substrate so as to close the aperture of the trench opening into the face without filling the via cavity. Then the polymer does not go into the via and closes same by covering it like a cap.
- the aspect ratio of the largest dimension of the via section relative to the depth thereof up to the trench ranges from 0.1 to 10.
- the trench has a first aperture opening into the via cavity and a second aperture opening into the face, with the second aperture being larger than the first one.

Unless otherwise indicated in the context of the present application, the terms "thickness" and "depth" refer to dimensions oriented along the thickness of the substrate, between the front and the backsides thereof.

The terms like "positioned on", or "above" do not systematically mean a direct contact, but, a priori, any position where stacking is effective. This includes the presence of interlayers between the superimposed parts.

When the through vias are made last, according to the so-called « via last» method mentioned above, the diameter of TSVs is typically in a range of values from 20 μm (μm=$10^{-6}$ metre) to 200 μm. It should be noted here that we are not trying to completely fill the through hole using a metal conductor, generally copper, mainly because of the cost thereof. As the electrolytic deposit is preferably made on the surface, the time required for integrally filling the vias would be several hours. As the surface deposit is much more important than at the bottom of the holes, a very important quantity of copper would be necessary to fill the vias. For example, for 5 μm deposited on the surface of a TSV having a diameter of 40 μm and having an aspect ratio of 1:3 (diameter/thickness ratio), only 0.8 μm is effectively deposited on the bottom. The filling of the TSVs implies that a chemical mechanical removal of the metal in excess would be necessary, which would be a long and very expensive operation. In addition, the copper mass deposited would create mechanical stresses in the materials during the various heat treatments connected to the manufacturing process and could induce dislocations in the surrounding silicon when expanding.

The sides of the via are simply metallized, using a conducting layer having a thickness of a few microns deposited, for example, using an electrolytic method. Such metallization of the inside of the via makes it possible to simultaneously metallize the lines of the RDL level, according to a series of steps described in the following figures.

FIGS. 2a to 2h illustrate the steps of the standard method for forming through vias (TSVs) and the redistribution (RDL) level of the vertical interconnections between the chips.

Figure 2A:
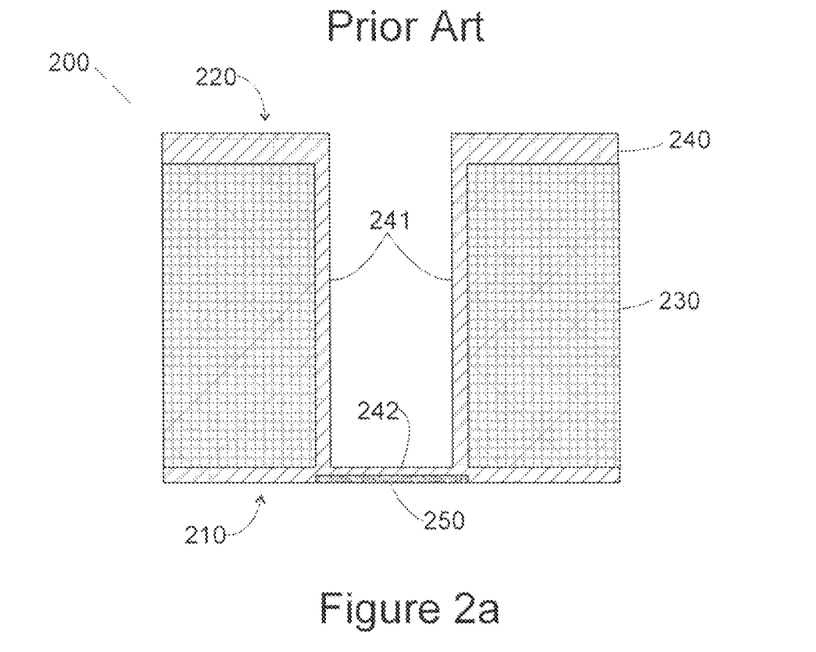
FIGS. 2a to 2h and 3h illustrate the steps of the standard method for forming through vias (TSVs) and the redistribution level (RDL) of the vertical interconnections.

FIG. 2a shows the initial condition of one TSV 200 being produced. It should first be noted that, in this Figure, and in all the following ones, the so-called « frontside» 210, the one from which the functional components of a chip have been produced, is shown as the lower face of the diagram of the TSV. The so-called « backside» 220 is shown as the upper face of the TSV.

At this point, the TSV 200 has been etched through the whole thickness of the chip 230 and an isolating layer 240 has been laid, which provides the electric isolation, more particularly between the sides 241 of the TSV and the semi-conducting material composing the substrate of the chip, generally silicon. The vias are etched opposite the metallic lands 250 which have been formed at the same time as the interconnections of the components provided on the frontside 210 of the chip, during the so-called production « line end» generally designated by the acronym BEOL for « back-end of line» where the interconnections of the chip components are provided.

Figure 2B:
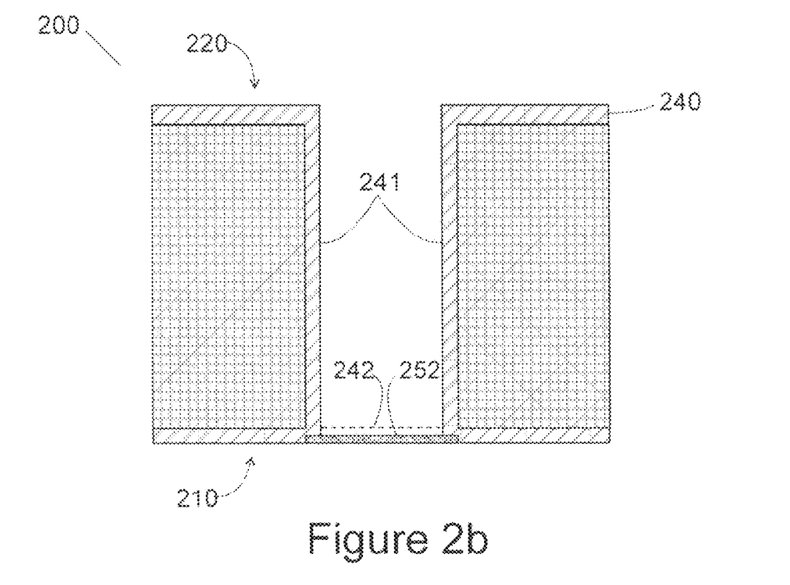

FIG. 2b shows the result of etching the part of the isolating layer composing the layer 240 which is located on the bottom 242 of the vias. Such etching operation is very anisotropic so as to preferably etch the bottom 242 rather than the sides 241 of the via until the metal of the land 250 is exposed 252 to enable a correct electric contact thereon, without exposing the sides 241. Etching is preferably of the plasma or ionic machining types. It should be noted that during such operation, the oxide layer 240 of the backside 210 is etched at least as deep as the bottoms of the vias.

Figure 2C:
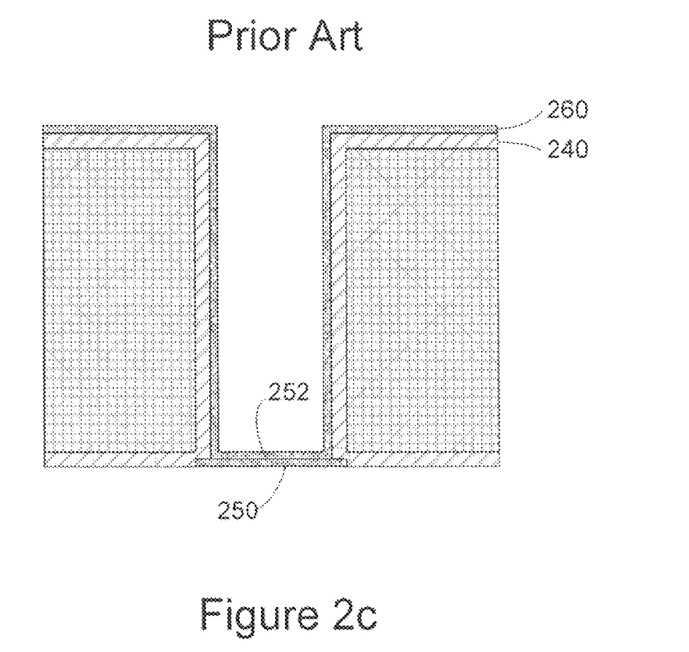

FIG. 2c shows the next step during which a continuous metallic conducting layer is deposited 260, generally copper. The deposition of such layer is preferably performed by physical or chemical vapor deposition, and such deposition methods are respectively designated by the acronyms PVD and CVD, « physical vapor deposition» and « chemical vapor deposition» . Other deposition methods may be used.

The deposition of the layer 260 may be preceded, (depending on the nature and the compatibility of the layer 260 with the isolating layer) by the deposition barrier of a primer layer (not shown) and a layer (not shown) preventing the diffusion of copper into the silicon. This may be, for example, titanium and titanium nitride (Ti/TiN) layers. Of course, such functions (primer and barrier) could also have been provided by only one layer.

Upon completion of this step, a correct electric contact is provided between the layer 260 and the land 250 at the interface 252.

Figure 2D:
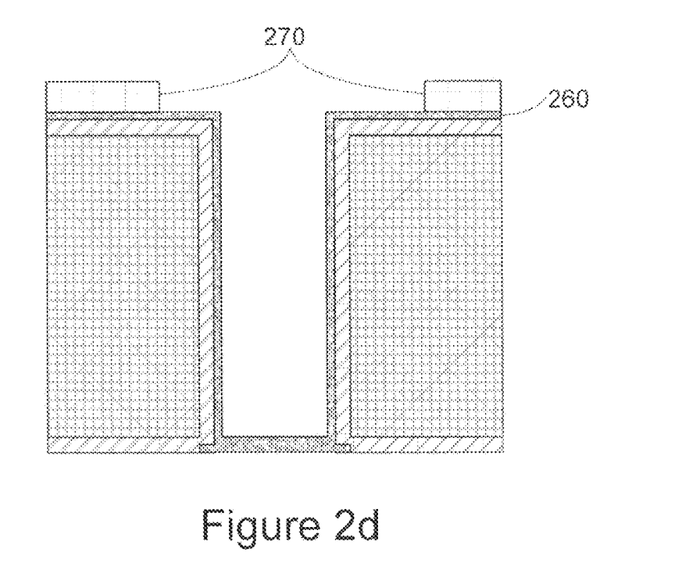

FIG. 2d illustrates the step during which the copper patterns of the redistribution (RDL) layer are defined on the backside of the chips using a photosensitive polymer which will compose the masking resist for the next operation. The patterns 270 are normally defined by photolithography.

Figure 2E:
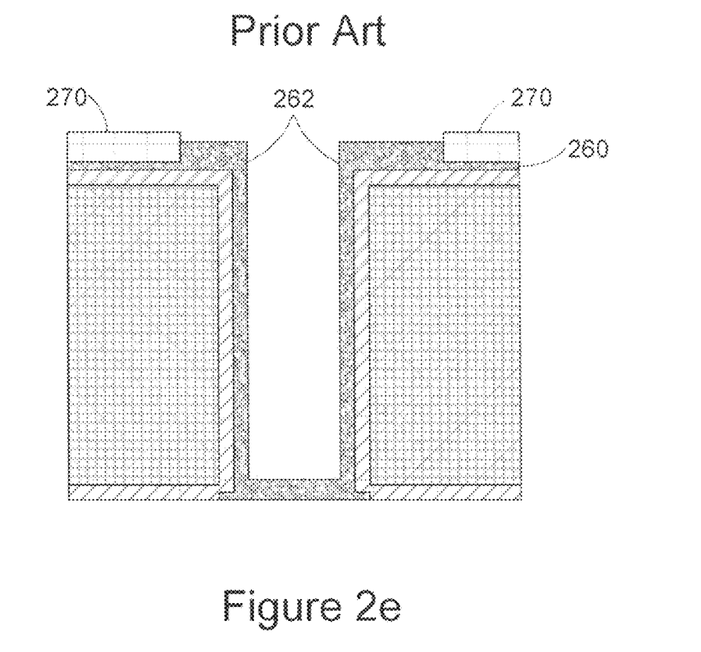

FIG. 2e shows the result of the step of growth of the initial metallic layer 260, generally copper. The growth is localised on the areas which have not been protected by the resist 270, during the previous step. The growth is preferably executed electrolytically. A thickened layer 262 is thus obtained.

Figure 2F:
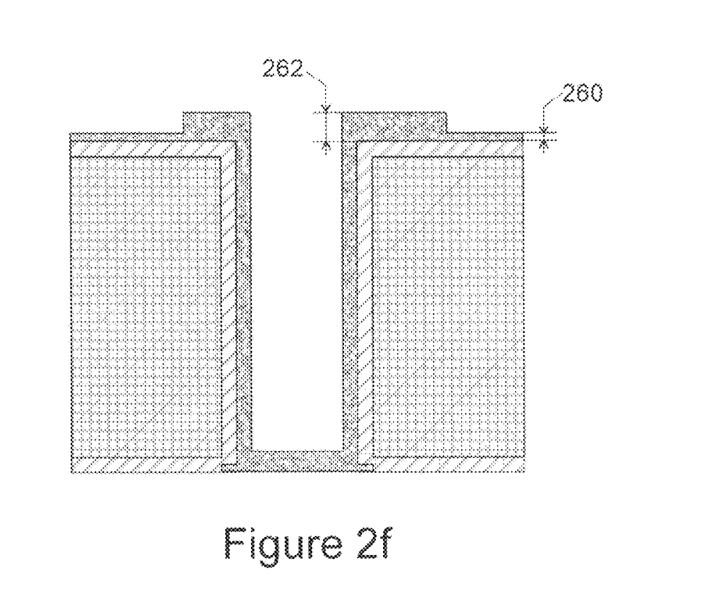

FIG. 2*f* illustrates the step during which the masking resist is removed. The removal of the resist leaves a continuous layer of copper having two different thicknesses on the backside, with one corresponding to the initial layer 260, and the other one corresponding to the thickened layer 262 defining the redistribution (RDL) layer patterns.

Figure 2G:
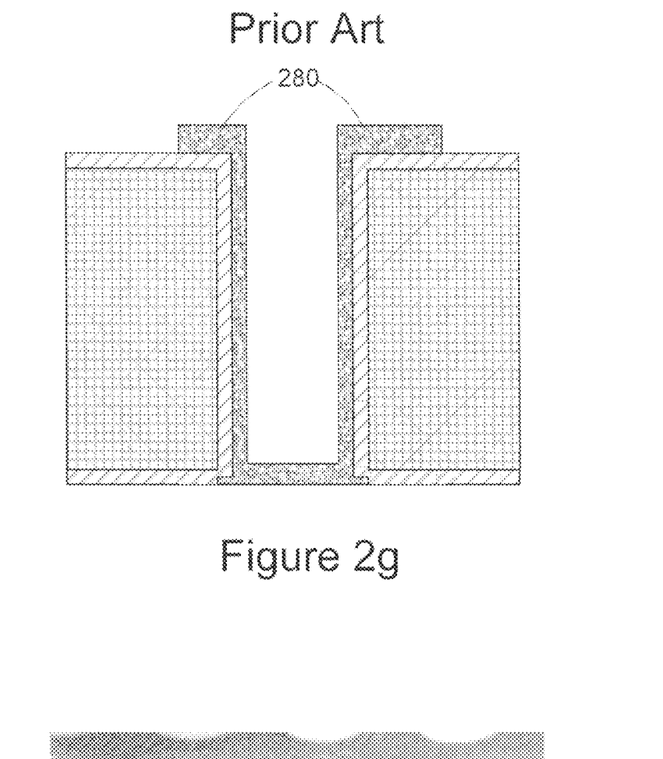

FIG. 2*g* shows the final result after the removal of the initial layer 260 and of the primer layer and the copper diffusion barrier layer mentioned above (not shown). Etching is typically executed using a plasma or a ionic machining method, or using a wet method (chemical etching) or using a combination of the three methods.

Figure 2H:
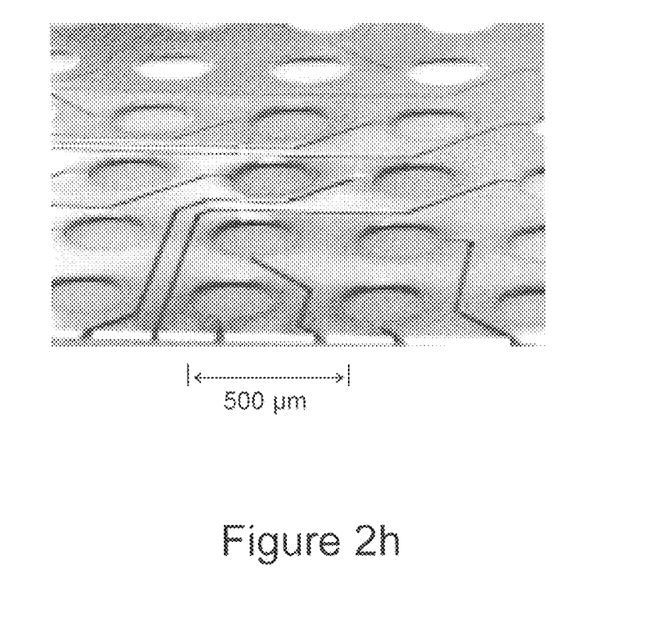

FIG. 2*h* is a picture taken with a scanning electron microscope (SEM) showing an example of RDL patterns defined in a photosensitive polymer before the electrolytic metallisation operation corresponding to FIG. 2*e*.

The standard method briefly described in FIGS. 2*a* to 2*h* above raises many problems:

Chemistry which can etch the primer layer and the copper diffusion barrier layer limits the choice of materials liable to be used for such layers. For example, tantalum nitride would advantageously be used, but such material cannot be wet etched, selectively, as compared to copper. Tantalum nitride is a very stable material, and no chemistry is able to etch it selectively without damaging the other present materials. Similarly, no plasma chemistry can be used for etching in the micro-electronic industry. Eventually, ionic machining method could make it possible to remove it, but this etching would be long and expensive and have a significant impact on the conductors layers and on the isolating material positioned thereunder.

The photolithography of the patterns at the RDL level in a photosensitive resist with a correct resolution is always made difficult by the presence of the continuous copper bottom 260, because of the bad adhesion of the resist which induces infiltrations and a loss of definition and of the slanting profile of the resist.

The presence of a masking polymer during the electrolysis of copper is not compatible with any of the available chemical techniques. For example, a so-called «patching» chemistry, which sometimes becomes necessary because of the presence of very small quantities of copper at the bottom of the vias, cannot be used, since it causes the dissolution of this polymer (basic chemistry).

The chemical etching of some materials and more particularly copper (Cu) and titanium (Ti) partially attacks the conduction lines, more particularly the interfaces thereof, and this reduces the width of the lines or the thickness thereof and may even cause the separation of the latter by lateral over-etching and the complete consumption of the material to be etched at the conductor/barrier interface. More particularly, the chemical etching of titanium is difficult to control and is characterised by a very significant lateral over-etching under the copper lines.

The aspect ratio and the depth of the vias result in less copper being deposited at the bottom than at the top thereof. The etching of the continuous copper bottom 260 illustrated in the step shown in FIG. 2*g* causes the thinning, or even the complete suppression of the thin copper layer deposited at the bottom of the vias.

The surface condition of the RDL copper is significantly damaged by the successive chemical attacks. These induce strong roughness and difficulties in obtaining a correct contact thereon. Copper also has a greater oxidation propensity, which increases the proportion of defects, which affects the reliability of the component.

Figure 3A:
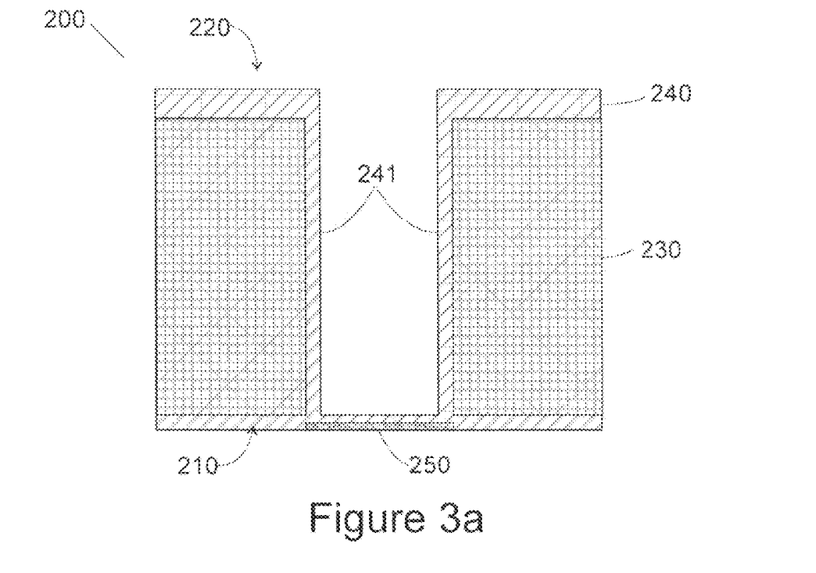
FIGS. 3a to 3g and 3i illustrate the steps of the enhanced method according to the invention which more particularly makes it possible to obtain a planar surface of the redistribution level and a better definition.
Figure 3B:
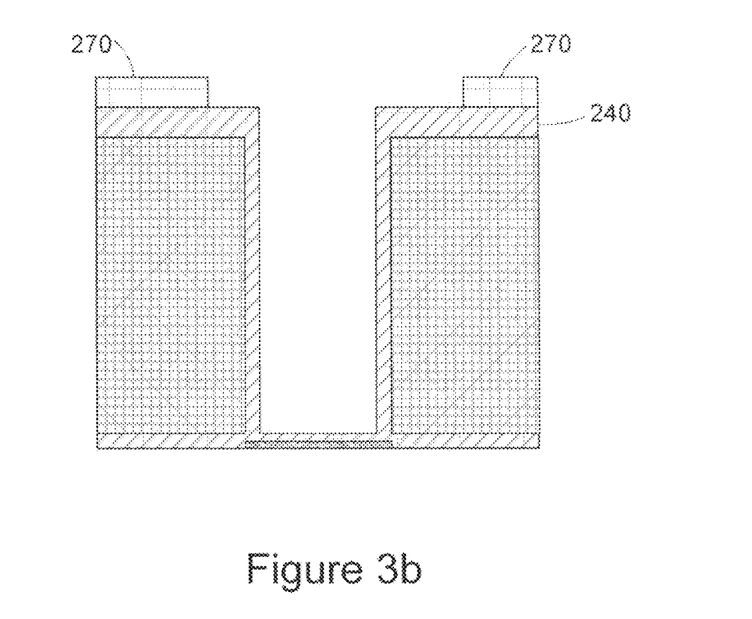
Figure 3C:
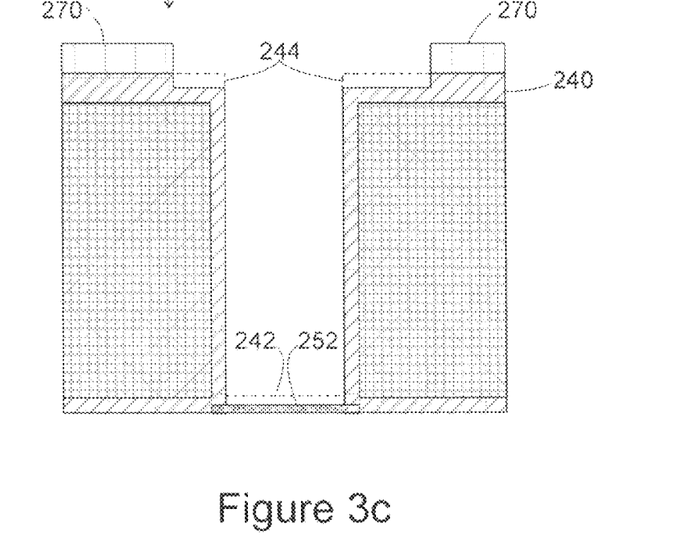
Figure 3D:
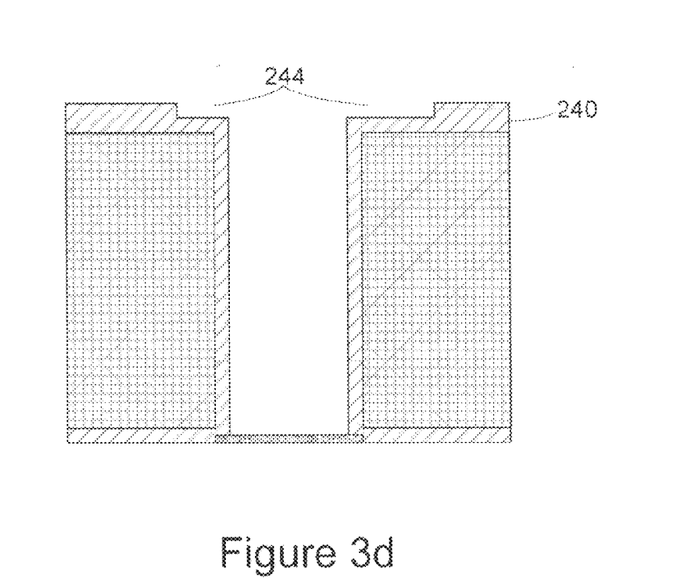
Figure 3E:
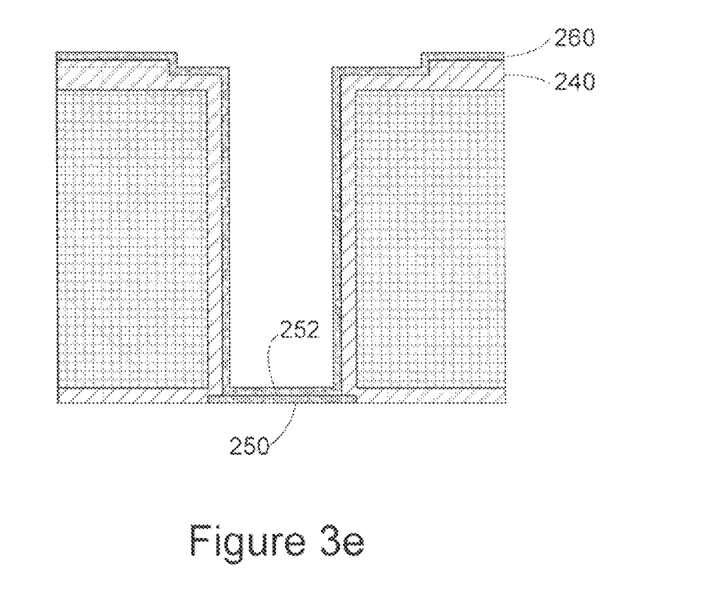
Figure 3F:
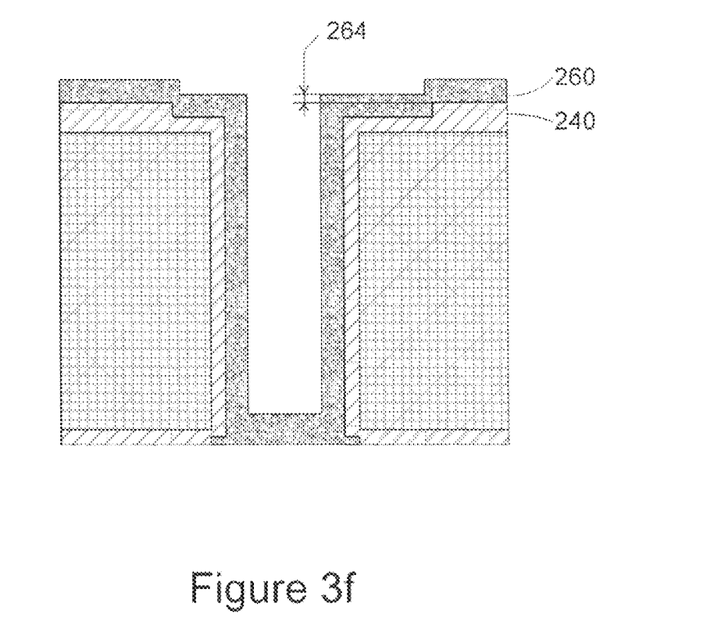
Figure 3G:
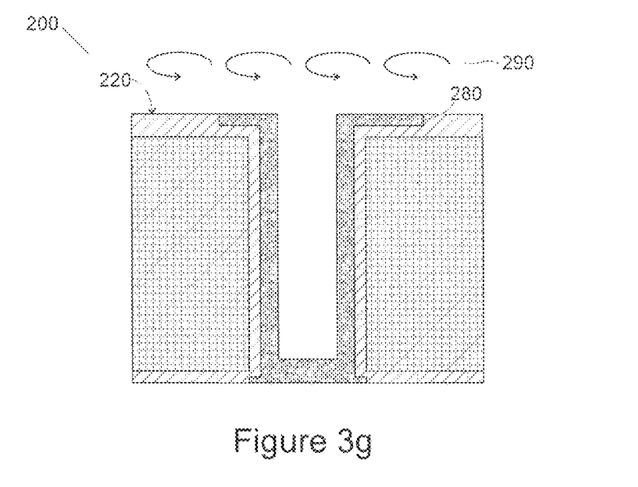
Figures 3H, 3I:
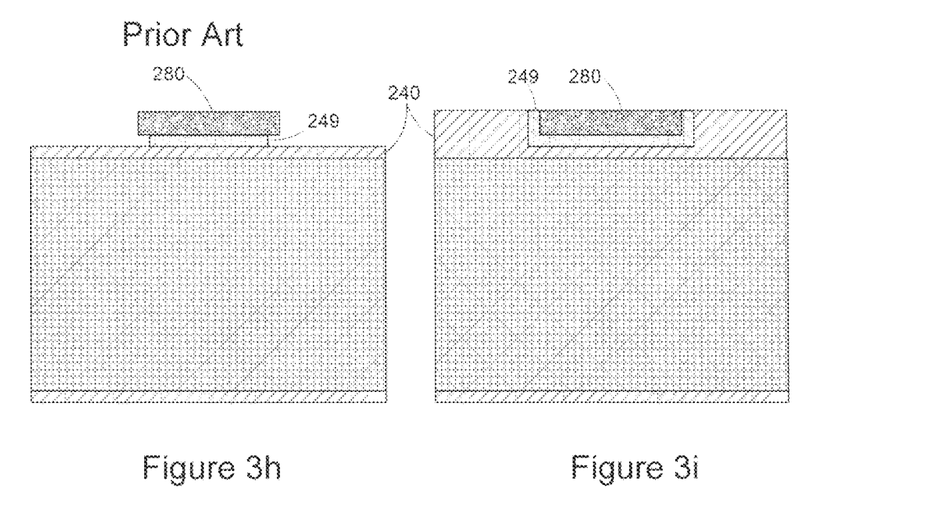

The final surface topology, as shown in FIG. 3*h*, is not planar. The production of another level of redistribution line there above, and more generally any other additional technological stacking can hardly be considered.

The final topology requires using a passivation polymer, the utilisation of which is difficult and cannot be repeated. Additionally, such polymer does not totally protect copper against oxygen. A risk of diffusion of copper inside the polymer exists, which is liable to cause short circuits between the conduction lines.

FIGS. 3*a* to 3*g* and 3*i* describe the method of the invention which at least partially solves the problems raised by the standard method for forming the through vias and the redistribution layer described above.

The invention may be applied to vias having any shape and dimensions. For example, the vias may have a circular section, but not only a circular one. A polygonal section may also be considered.

The deposition phases mentioned hereinunder for the invention are not limited by default to a one-step deposition. Deposition may be carried out in several steps and the deposited final layer may result from a plurality of stacked sublayers.

FIG. 3*a* illustrates the starting point of the method of the invention. It is similar to FIG. 2*a* showing the standard method. It shows the initial condition of a TSV 200 being produced. It should be reminded that the TSV concerned by the invention may be of the large section and/or deep type and requires a partial filling. We can see the frontside 210 from which the functional components of a chip have been produced and the backside 220 where the redistribution level will be provided. At this point, the TSV 200 has been etched through the whole thickness of the substrate of the chip 230, as before, in order to define a via cavity and an isolating layer 240 has been deposited, such as silicon oxide, which provides electric isolation, more particularly between the sides 241 composing the side wall of the TSV via and the semi-conducting material the chip is made of, generally silicon. The substrate through which the TSV 200 is positioned may, unlike the illustrated case, have a complex structure and more particularly comprise a plurality of layers of different materials. The vias are etched opposite metallic lands 250 which have advantageously been etched simultaneously with the interconnections of the components provided on the frontside 210 of the chip during the «back-end of line» (BEOL) operations.

FIG. 3*b* illustrates the following step of the method of the invention wherein a masking, advantageously by photolithography, of the photosensitive resist layer is firstly be executed in order to define the patterns 270 of the redistribution layer. Unlike the standard method, the resist layer is deposited on the isolating layer 240 prior to the deposition of the metallic layer from which the redistribution level (RDL) will be created, thus avoiding the problems of adhesion of the resist on copper, as mentioned above.

FIG. 3*c* shows the result of the following step, wherein the part of the isolating material forming the layer 240 located at the bottom 242 of the vias, i.e. on the metallic lands 250 is etched. As before, such etching operation is advantageously very anisotropic in order to etch preferably the bottom 242 rather than the sides 241 of the via (step referenced 252) the metal of the land 250 is exposed to enable a correct electric contact thereon. The part of the oxide layer 240 of the backside 220 of the chip which is not protected by the resist patterns 270 is also etched. This time, the redistribution layer patterns are etched in the oxide layer 240 by creating therein level differences recessed in the surface of the backside, in order to form trenches 244. The shape and dimensions of the trenches are not restrictions to the invention. The trenches generally extend along the plane of the backside so as to produce the electric connections to be used for the redistribution. A rectangular section is possible for the trenches, depending on the thickness of the substrate. The length thereof can vary, depending on the redistribution to be provided.

Then, as illustrated in FIG. 3d, the masking resist is then removed. The photolithography operations and the removal of resist after etching can conventionally be executed, according to techniques developed by the micro-electronic industry. The removal of the masking resist leaves the trenches 244 etched in the oxide layer 240 untouched.

A full wafer deposition of a metallic continuous bottom 260, generally made of copper can then be executed. FIG. 3e illustrates the result of this step. The deposition of the layer 260 is preferably preceded by the deposition of a primer layer (not shown) and a layer (not shown) forming a barrier to the diffusion of copper into silicon. These may be, for instance, layers of titanium nitride (TiN) or of tantalum nitride (TaN). The latter material, which is a much better barrier than TiN may be used in the method of the invention unlike the standard method. As a matter of fact, we will see hereinafter that the TaN layer will advantageously be removed using a chemical mechanical planarization method borrowed from BEOL in micro-electronics and the only element capable of efficiently removing such material.

Upon completion of this step, a correct electric contact is established between the layer 260 and the land 250 at the interface 252.

FIG. 3f illustrates the following step of growth of the thickness of the continuous metallic bottom 260. For this purpose, a layer of electrolytic copper sufficiently thick to cover and exceed 264 the top of the trenches which have been formed in the oxide layer is then deposited on the whole wafer. The deposited copper layer must also be sufficiently thick to provide a correct electric conduction between the bottom and the top of the via. For example, more than one micron is rarely etched in the dielectric, in order to produce the RDL boxes. At least 3 microns of copper will then have to be deposited to provide a correct filling of the boxes and a correct chemical mechanical planarization by removing excess copper from the surface. Generally speaking, at best 3 microns can be expected on the sides of the TSV. Conversely, a large quantity of copper can be deposited in order to enable a more important laying of the sides of the TSV, and, for example it is possible to deposit 25% of the radius of the TSV and thus enhance the electric conduction, without affecting the thickness of the RDL lines determined by the etching of the box into the oxide only. Unlike the standard method, such method thus enables a total separation of the thickness of the lines and that of the sides of the TSV.

Optionally, in order to protect the deposit of copper, a passivation layer will be deposited, made of the electrolytic nitride or a passivation polymer. The passivation layer may integrally fill the via cavity and more particularly close the whole of the residual inner space, up to the aperture of the trench opening into the face 220 of the substrate.

When a passivation polymer is used, the latter is preferably so deposited as to form a superficial film, i.e. only on the surface above the face 220. The via cavity is then closed by such deposit without however being totally filled with said polymer.

FIG. 3g illustrates one example of the final result obtained when a mechanical or a chemical mechanical planarization 190 of the surface 220 is completed. Typically, this is chemical mechanical polishing designated by the acronym CMP «chemical mechanical polishing». This operation removes the previous passivation layer (if present), the copper layer, where it exceeds the top of the trenches 244, and the diffusion barrier layer and the primer layer (not shown). It leaves a final layer forming a conduction line 280 (which covers the patterns of the trenches 244) and preferably stops on the isolating layer 240.

A perfectly planar surface with partially filled vias 200 is thus obtained. It is then possible to deposit again some dielectric or passivating material to finalise the contact, or to provide a new redistribution level with a similar or another method. The possible deposition of a dielectric or passivating material may completely fill the residual inner space of the vias left by the partial deposition of the conducting material of the bottom 260.

FIGS. 3h and 3i show, for comparison purposes, a cross-section of a RDL level conduction line, respectively, with the standard method and the method of the invention. It can be seen in FIG. 3i that the conduction line 280, generally made of copper, obtained with the method of the invention, is totally surrounded by the diffusion barrier layer 240. The whole assembly is embedded in the oxide layer 240 and forms a perfectly planar surface.

The advantages of the structure illustrated in FIGS. 3g and 3i and of the method of the invention are potentially numerous:

The method of the invention entails no additional step. The impact thereof on the total cost is limited to the addition of a step of chemical mechanical polishing (CMP) which is compensated by the elimination of the two etching steps: that of the continuous copper bottom and that of the diffusion barrier.

The elimination of the steps of wet etching overcomes in fact the problems of lateral over-etching of copper and of the diffusion barrier. This makes it possible to provide much thinner redistribution lines, without any risk of complete separation thereof. The current limit with the standard method on the width of copper lines is about 10 μm. Such technique allows lines width of less than 1 μm.

Additionally, without wet etching of the continuous copper bottom, copper at the bottom of the vias is preserved, which avoids any step of additional passivation. Thicker conductor thus remains, which reduces the global resistivity of the via and enhances the reliability thereof, more particularly if it is filled with a passivation polymer afterwards.

The method of the invention makes it possible to increase the thickness of copper electrolytically deposited and to reach the specified thickness on the vias sides. The resulting surface extra thickness will be eliminated by the step of chemical mechanical planarization (CMP). The thickness of the vias sheath conductor (the conducting layer on the vias sides) thus becomes totally independent of that of the surface redistribution lines.

The redistribution lines conducting material is no longer affected by the steps of wet etching (roughness and surface and sides corrosion), which increases the connections reliability.

The conduction lines 280 are perfectly isolated from each other (lateral isolation) with a better anchoring on the chip. The copper lower and side parts, for example, are encapsulated, in a true barrier material and a similar top passivation can also be considered.

The final surface is perfectly planar. This enables to fill the vias holes with a polymer material or any other dielectric material. Obtaining a perfectly planar surface makes it possible to produce several RDL levels.

The selection of the primer material and of the copper diffusion barrier is much wider.

All the 3D assembling applications which use the approach wherein the through vias are produced last or « via last» method can take advantage of the method of the invention. This is the case when electronic chips are produced which use, for instance, the widespread so-called CMOS technology, the acronym of « complementary metal-oxide-semiconductor» and/or micro-electro-mechanical systems or MEMS when all the steps of production of such devices have been completed. The invention is more particularly adapted for the production of passive and active 3D interposers.

Generally speaking, the applications requiring a high level of integration or a high density of connections can benefit from the invention by taking advantage of: either the much stricter rules defining the patterns on the redistribution levels; or of the planar surface which enables the production of several levels of interconnections.

The invention claimed is:

1. A method for producing at least one via in the thickness of a substrate and an electrically conducting line connected to the via and formed on a face of the substrate, sequentially comprising:

forming, from the face, a via cavity comprising a side wall and a bottom;

forming an isolating layer on the side wall and the bottom of the cavity and on the face of the substrate;

forming at least one line pattern on the face of the substrate, comprising forming a trench in a portion of the isolating layer positioned on the face, with the trench opening into the via cavity, the trench being formed by an etching configured to remove a portion of the isolating layer located on the bottom of the cavity; and filling with an electrically conducting material both the line pattern and the via cavity, a filling so configured as not to totally fill said cavity.

2. The method according to claim 1, wherein the etching is preceded by a step of photolithography so configured as to define a trench pattern.

3. The method according to claim 1, wherein the filling has a thickness at least equal to a dimension in depth of the trench.

4. The method according to claim 3, comprising, after the filling, a thinning of the substrate from the face until the electrically conducting material disappears outside the trench.

5. The method according to claim 4, wherein the thinning is obtained by a chemical mechanical polishing.

6. The method according to claim 1, wherein the filling is executed in two steps comprising a first step of depositing a conducting continuous bottom and a second step of electrolytic growth so configured as to fill the at least one trench without totally filling the via cavity.

7. The method according to claim 1, wherein the filling is followed by a deposition of a passivation layer.

8. The method according to claim 7, wherein the passivation layer is made of a dielectric material.

9. The method according to claim 7, wherein depositing a passivation layer is carried out so as to integrally fill the via cavity.

10. The method according to claim 7, wherein the passivation layer is made of a polymer material and wherein depositing the passivation layer is executed onto the face of the substrate so as to close the aperture of the trench opening into the face without filling the via cavity.

11. The method according to claim 1, wherein the aspect ratio of a largest dimension of a via section relative to a depth thereof up to the trench ranges from 0.1 to 10.

12. The method according to claim 1, wherein the trench has a first aperture opening into the via cavity and a second aperture opening into the face, with the second aperture being larger than the first one.

* * * * *